United States Patent
Kamat

(10) Patent No.: US 7,669,158 B2
(45) Date of Patent: Feb. 23, 2010

(54) METHOD AND SYSTEM FOR SEMICONDUCTOR DESIGN HIERARCHY ANALYSIS AND TRANSFORMATION

(75) Inventor: Vishnu Govind Kamat, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 206 days.

(21) Appl. No.: 10/955,067

(22) Filed: Sep. 30, 2004

(65) Prior Publication Data

US 2006/0075371 A1    Apr. 6, 2006

(51) Int. Cl.
G06F 17/50    (2006.01)
(52) U.S. Cl. .......................... 716/8; 716/10
(58) Field of Classification Search .......... 716/1, 716/2, 8–12
See application file for complete search history.

(56) References Cited

U.S. PATENT DOCUMENTS

| | | | |
|---|---|---|---|
| 6,009,250 A * | 12/1999 | Ho et al. ............... | 716/5 |
| 6,011,911 A * | 1/2000 | Ho et al. ............... | 716/5 |
| 6,249,904 B1 | 6/2001 | Cobb | |
| 6,253,364 B1 * | 6/2001 | Tanaka et al. ......... | 716/13 |
| 6,301,697 B1 | 10/2001 | Cobb | |
| 6,370,679 B1 | 4/2002 | Chang et al. | |
| 6,467,076 B1 | 10/2002 | Cobb | |
| 6,505,327 B2 | 1/2003 | Lin | |
| 6,560,766 B2 | 5/2003 | Pierrat et al. | |
| 6,735,742 B2 * | 5/2004 | Hatsch et al. ......... | 716/2 |
| 6,757,876 B2 * | 6/2004 | Habitz ................... | 716/5 |
| 6,865,726 B1 * | 3/2005 | Igusa et al. ........... | 716/18 |
| 6,951,004 B2 * | 9/2005 | Kamon .................. | 716/11 |
| 2002/0199157 A1 | 12/2002 | Cobb | |

OTHER PUBLICATIONS

Rieger, Michael L. et al., "OPC strategies to minimize mask cost and writing time," 21st annual BACUS Symposium on Photomask Technology, Proceedings of SPIE vol. 4562, pp. 154-160, 2002.
Rieger, Michael L, et al, "Anticipating and controlling mask costs within EDA physical design," Proceedings of SPIE, vol. 5130, pp. 617-627, 2003.

* cited by examiner

*Primary Examiner*—Jack Chiang
*Assistant Examiner*—Binh C Tat
(74) *Attorney, Agent, or Firm*—Sheppard Mullin Richter & Hampton LLP

(57) ABSTRACT

A method and apparatus for partitioning of the input design into repeating patterns called template cores for the application of reticle enhancement methods, design verification for manufacturability and design corrections for optical and process effects is accomplished by hierarchy analysis to extract cell overlap information. Also hierarchy analysis is performed to extract hierarchy statistics. Finally template core candidates are identified. This allows to the design to be made amenable for design corrections or other analyses or modifications that are able to leverage the hierarchy of the design since the cell hierarchy could otherwise be very deep or cells could have significant overlap with each other.

26 Claims, 6 Drawing Sheets

METHOD AND SYSTEM FOR SEMICONDUCTOR DESIGN HIERARCHY ANALYSIS AND TRANSFORMATION

BACKGROUND OF THE INVENTION

The process of fabricating integrated circuits typically involves a functional design step, followed by a physical design step. During the functional design step, a design concept is described using a hardware description language and is then converted into a netlist, which specifies the electronic components and the connections between the components. The physical design step specifies the placement of the electrical components or elements on the chip and routing of the connections between the electrical components thereby implementing the netlist. The physical design process generates the physical design data, which are synonymously called layout data, layout, or target layout.

The target layout defines a set of binary patterns or objects, which are also called "features" or "geometric features". Usually the objects are represented as a polygon or collection of polygons in the layout data in order to facilitate the specification of the objects.

Each object can be a part of an electronic component such as a gate of a transistor or a connection between components. Each polygon object has vertices and edges joining the vertices. Each vertex is usually defined by its coordinates in a Cartesian x-y coordinate system. In a typical very-large scale integrated (VLSI) circuit, most edges are parallel to the x or y axis.

Often the physical design data are stored and transmitted in a machine-readable format such as GDSII format, OASIS™ format, or in a database such as OpenAccess database technology or Milkyway™ design database. See, for example, OpenAccess: The Standard API for Rapid EDA Tool Integration, 2003 by Si2, Inc; Milkyway Foundation Database for Nanometer Design, Synopsys, Inc. 2003.

In these formats or databases, the layouts are often described hierarchically. This has the advantage of reducing file sizes and improving efficiency for certain changes, since some patterns are placed multiple times in the layout. Repeatedly describing the same structure in detail can thus be avoided.

In the layout hierarchy, a cell is a subset of the layout pattern that can be referenced as a whole object. Thus, cells can be included in the layout by reference. Inclusions by reference can further be nested.

Often, the hierarchy of the layout resembles a tree. The leaves of a tree are attached to its branches. Branches are attached to larger branches. The hierarchy of branches continues until the trunk of the tree reaches its roots. Leaf cells of a circuit are cells that do not include any cells by reference. A leaf cell comprises a set of objects, which are usually polygons. A child cell is included in its parent cell. A root cell it is not included in any other. A layout can have multiple root cells resembling a forest with multiple trees. And cells can be referenced a number of times within a single parent cell or by multiple parent cells.

Multiple instances of a cell can be described by a structure reference or an array reference. A structure reference places an instance (a copy) of a cell at a particular (x,y)-offset within a parent cell. Each instance has transformation information, which can often include translation, magnification, reflection, and/or rotation. An array reference describes multiple instances of a cell that are placed on a set of locations that form a grid or array. The array is defined by: 1) a number of rows; 2) a number of columns, 3) row and column spacings, 4) (x,y) offset of an instance; and 5) a set of magnifications, reflections, and rotations that are common to all cells in the array.

If a layout does not have hierarchy, it is called flat. A layout can be flat as per design. Sometimes a hierarchical layout can be flattened. Flattening a layout means removing its hierarchical organization by replacing each cell reference by the set of polygons contained in the cell that is referenced.

Semiconductor device manufacturing comprises many steps of patterning layers according to the layout data. A layer is either the substrate of the semiconductor wafer or a film deposited on the wafer. At some steps, a pattern is etched into a layer. At some other steps, ions are implanted, usually in a pattern, into the layer. Generally, patterning comprises: lithography, and etch or implant.

The prevalent form of lithography is optical projection lithography. This involves first making a mask or reticle that embodies the pattern to be projected onto the wafer. An image of the mask's pattern is then optically projected onto a photoresist film coated on the wafer. This selectively exposes photoresist. The latent image is then developed, thereby making a stencil on the wafer.

Other forms of lithography include: mask-less optical projection lithography where the mask is replaced by a spatial light modulator. The spatial modulator is typically an array of micro-machined mirrors that are illuminated and imaged onto the wafer. The spatial light modulator is driven by the lithography data. Direct electron-beam writing lithography, electron projection lithography, and imprint lithography are other forms of lithography.

Modern semiconductor lithography processes often print features that are smaller than the exposure wavelength. In this regime, which is called the low-$k_1$ regime, the field and wave nature of light is prevalent, and the finite aperture of the projection lens acts as a low-pass filter of spatial frequencies in the image. Thus, it may be difficult for the projection lens to reproduce the high spatial frequency components required to reproduce the sharp edges or corners in polygon objects for example. Also, light entering a mask opening from one object may impact another shape in close proximity, leading to a complex interaction of the electric fields of adjacent objects. Thus, the final shapes that are produced on the wafer will often have rounded corners and may bulge towards adjacent objects in ways that can impact the process yield. This resulting image distortion, called optical proximity effect, is responsible for the most significant distortion that arises in the transfer of the mask pattern onto the wafer.

Another source distortion is resist process effects. Diffusion and loading effects during resist and etch processing impact the fidelity with which a pattern can be rendered or transferred to the wafer.

Optical Proximity Correction (OPC) is the process of changing, or pre-distorting, the target layout data to produce lithography data so that the pattern that is etched in the wafer is a closer replica of the target layout. The goal of OPC is to counter the distortions caused by the physical patterning process (see A. K-T Wong, Resolution enhancement techniques in optical lithography, SPIE Press, Vol. TT47, Bellingham, Wash., 2001; H. J. Levinson, Principles of Lithography, SPIE Press, Bellingham, Wash., 2001). In effect, the objects or polygons of the lithograph data are modifications from those specified by the target layout in an effort to improve the reproduction of the critical geometry. This is often accomplished by moving object edges and by adding additional objects to the layout to counter optical and process distortions. These corrections are required to ensure the intended target design pattern fidelity is met improving the process window and consequently manufacturing yield.

Application of many reticle or resolution enhancement technologies (RET) can also have the effect of changing the layout data relative to the lithography data. RET also addresses distortion in the lithography process by pre-compensation. Typically, RET involves implementing a resolution enhancement technique like insertion of sub-resolution assist features (SRAF), phase shift enhancement using an attenuated phase mask, or designing a mask such that includes quartz etching to introduce phase shifting across features.

One issue is how the OPC, RET, and/or process corrections should be applied to repeating patterns such as instances of a cell in a hierarchical pattern description, such as in a structure reference or an array reference. The distortions usually have an environment and position dependence across the field of the mask. As a result, repeating patterns should receive distinct corrections for changes in the environment and position.

Typically, corrections are performed once on a repeating pattern and these corrections are propagated across all references or placements of the same pattern. To accommodate for field position and pattern environment dependent corrections, each of these placements needs to be further corrected to achieve the targeted feature fidelity on the wafer.

SUMMARY OF THE INVENTION

The design hierarchy of the layout data represents the logical, circuit functional hierarchy. In many cases this is not directly amenable for design corrections or other analyses or modifications that are able to leverage the hierarchy of the design since the cell hierarchy could be very deep or cells could have significant overlap with each other. Further, cell sizes can vary significantly. Small cells that are referenced within larger cells may be too small for any RET or OPC, optical and process corrections, and should in general be considered part of its parent for such purposes. Designs can also contain overlaps of cells and their polygons including intertwining of polygons that do not necessarily touch.

Invariably, these need to be accommodated during the RET and OPC steps, for example, which can be an added complexity to these methods. The design correction problem is to analyze the hierarchy and find a reasonable representation of the original design that facilitates the design correction, makes use of repeating patterns, and enables distribution of the work across a cluster of central processing units (CPU's) or on a shared memory multi-CPU machine. The application of such a representation can be extended to but not limited to design rule corrections, design verification and modification for manufacturing.

The invention relates to a method and apparatus for partitioning of the input design into repeating patterns called template cores for the application of reticle enhancement methods, design verification for manufacturability and design corrections for optical and process effects. This is accomplished by hierarchy analysis to extract cell overlap information. Also hierarchy analysis is performed to extract hierarchy statistics. Finally template core candidates are identified.

In general, according to one aspect, the invention features a method for modifying cells in a hierarchical integrated circuit design to address overlap regions between these cells. The method comprises traversing through the integrated circuit design and extracting overlap regions between overlapping cells of the integrated circuit design. These overlap regions are then collected into a different cell other than the overlapping cells.

As a result, the original hierarchy is generally maintained. However, the overlap regions are now in cells that can be further processed.

In the preferred embodiment, the different cell is a common parent cell of the overlapping cells. Preferably, it is the first common parent cell of the overlapping cells.

In the preferred embodiment, the integrated circuit design is modified to correct for optical and process distortions during rendering. Additionally, such distortions can include optical proximity effects along with reticle enhancement technologies that are used to address distortions due to the wave nature of light.

Further, according to the preferred embodiment, the process further comprises finding candidate cells for a template core designation. Typically, the template core designation is a repeating pattern to which the corrections are applied. These candidate cells are then tagged.

In the preferred embodiment, the corrections or cell modifications are applied to the modified cells that are produced during the extraction of the overlap regions. The candidate cells can be selected based on their size, frequency of occurrence and in relationship with their parent and child cells statistics.

In general, according to another aspect, the invention features a method for analyzing a hierarchical integrated circuit design. This method comprises traversing through the hierarchical integrated design and finding candidate cells for template core designation and then tagging these template cores. These template cores are typically designated based on their size or frequency of occurrence.

Also, this process can include the process of extracting overlap regions and then collecting those overlap regions into different cells, such as parent cells.

In general, according to another aspect, the invention features a system for modifying cells in a hierarchical integrated circuit design to address overlap regions. This system comprises a data store for storing the integrated circuit design and a processing resource. This processing resource traverses through the integrated design, extracting overlap regions between overlapping cells of the integrated design and collecting those overlap regions into different cells, other than the overlapping cells.

In general, according to another aspect, the invention features a system for analyzing a hierarchical integrated circuit design. The system comprises a data store for storing the integrated circuit design and a processing resource that traverses through the integrated circuit design finding candidate cells for a template core designation and tagging those cells.

In general, according to still another aspect, the invention features a computer software product for analyzing a hierarchical integrated circuit design. This product comprises a computer readable medium in which program instructions are stored. These instructions, when read by a computer, cause the computer to traverse through the integrated circuit design, extracting overlap regions between overlapping cells of the integrated circuit design and collect the overlap regions into different cells other than the overlapping cells.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
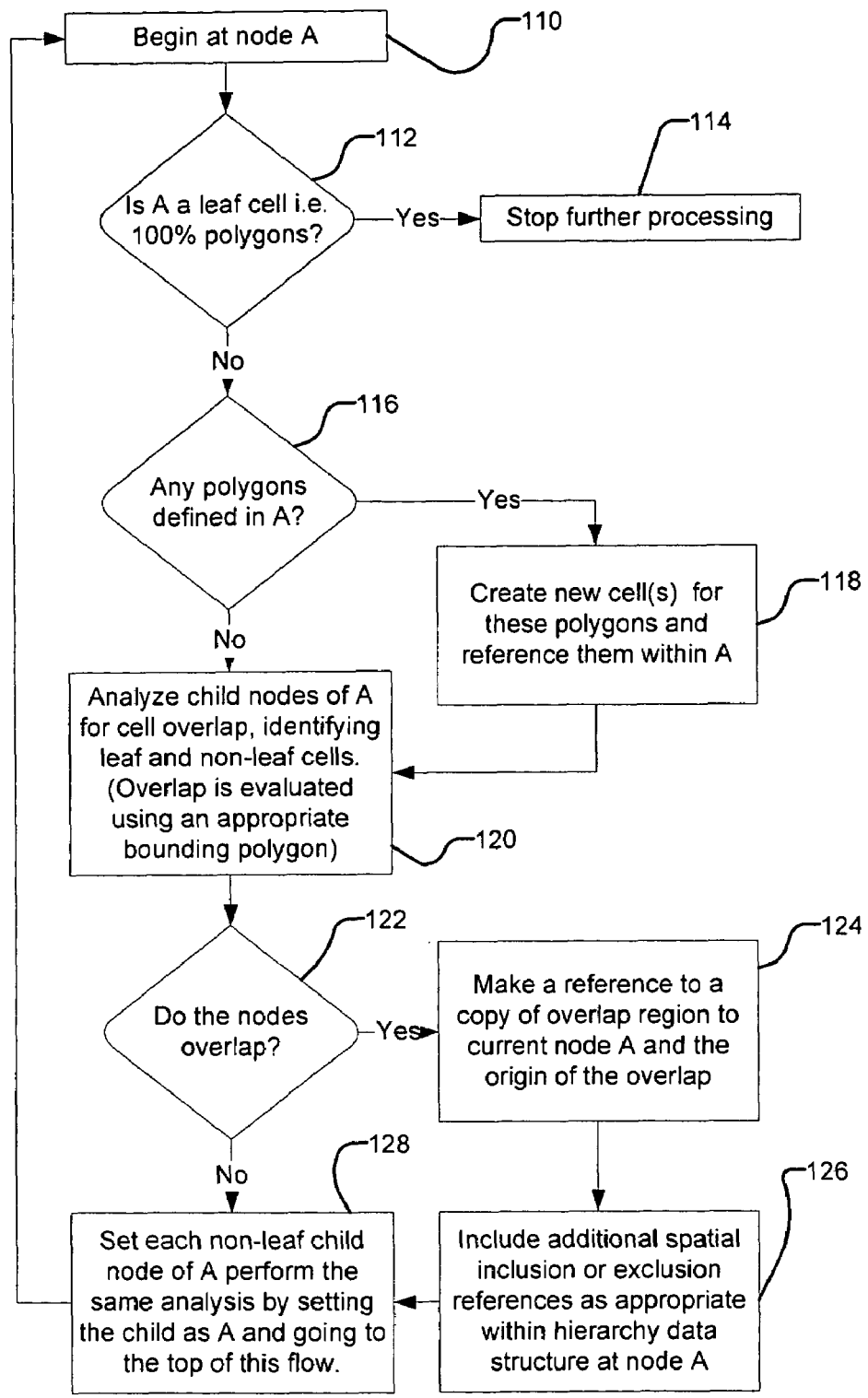
FIG. 1 s a flow diagram illustrating a method for modifying cells in a hierarchical integrated circuit design according to the present invention.

FIG. 1 illustrates the method for modifying cells in a hierarchical integrated circuit design that embodies principles of the present invention.

In more detail, processing begins at a node A in step 110. Initially this is the root node, which later become a current node as the process traverses the design.

In one embodiment, if there is no top cell, a common top cell is created and all cells are referenced into that top cell.

Next, in step 112, it is determined whether or not the node A is a leaf cell. A leaf cell has only polygons and no references to other cells.

If it is a leaf cell, then further processing is stopped in step 114.

If, however, the current node A is not a leaf cell, then it is determined whether or not any polygons are defined in node A in step 116.

If there are polygons, then a new cell(s) is created for these polygons and a reference is provided to this new cell within current node A in step 118. Typically, the number of cells created depends on the distribution and isolation of the polygons within the context of A. This is to avoid sparse polygons to be included in a single cell, which can generate false overlap results.

If, however, there are no polygons in the node A, then in step 120, the child nodes of the current node A are analyzed for cell overlap. Leaf and non leaf cells among these child cells are identified. Most importantly, an evaluation of overlap is performed.

The overlap determination is based on a bounding polygon. The bounding polygon box is defined as the smallest rectangle that encloses the set of polygons within the cell.

In other examples, however, this bounding polygon is defined as the geometric convex hull of polygons within the cell. The convex hull is the smallest convex polygon that contains all of the polygons within the cell.

However, defining the bounding polygon as the smallest polygon that contains all of the cell's polygons is only a benefit for detecting overlaps between polygons in the cell, but not non-overlapping polygons in one cell that intertwine with neighboring cells.

Generally, the choice is typically determined by the objective of the operation or the type of design being processed.

In step 122, it is determined whether or not the nodes of the current node overlap. If they do, then a copy reference of the overlap region is made in the current node A in step 124.

Further, in step 126, additional spatial inclusion or exclusion references are included in the current node as appropriate within the hierarchy data structure. When a cell overlap occurs between two (or more) cells, the overlap portion is included within one cell and excluded from the other. The spatial component corresponds to the exact location within the spatial placement of the interacting cells within the chip. Typically, other locations of these cells do not necessarily interact the same way.

In contrast if there are no overlap regions or after step 126, each non-leaf child node of A is in turn set as the current node and the processing returns to step 110.

In this way, the process of FIG. 1 walks through the typically tree-like hierarchical integrated circuit design, processing and modifying cells until the leaf cells have been processed and polygons pushed to leaf cells.

In one embodiment, template core identification precedes cell overlap analysis. In that case, the overlap analysis is restricted to overlaps between the identified template core candidates. In the final processed design, the template cores are then distinguished by distinct overlaps.

Figure 2:
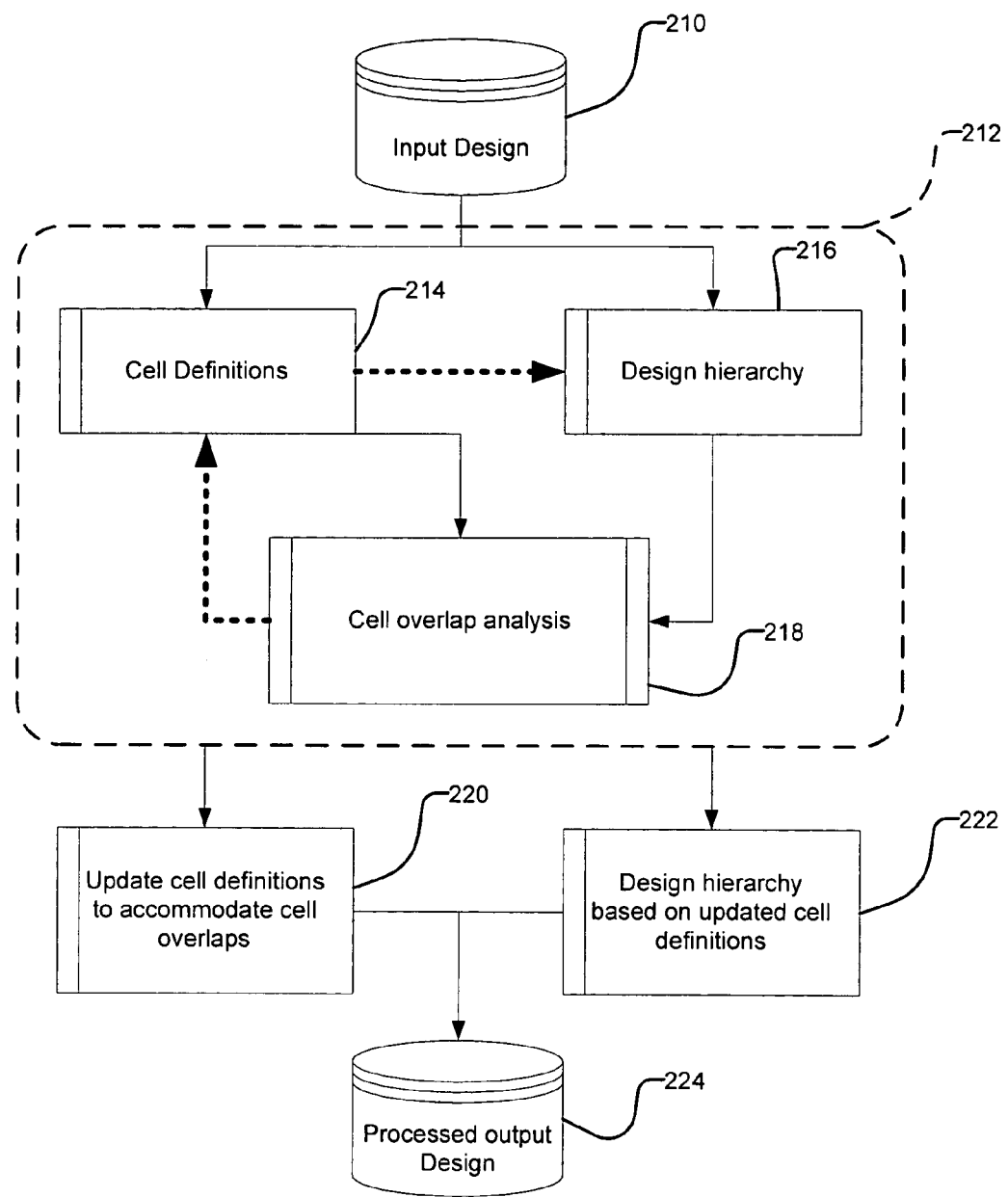
FIG. 2 is a flow block diagram illustrating the processing of the present invention.

FIG. 2 is a flow block diagram illustrating the processing of the present invention to address cell overlap regions.

Specifically, an input design stored in a data store 210 such as a disk array or server is provided to the compute resource 212. Compute resource 212 then picks the successive cell definitions in process block 214 and analyzes those cell definitions in the design hierarchy in block 216 of the input design.

The overlap analysis is performed in process block 218. The output of this processing are updated cell definitions that accommodate cell overlap and the overlap regions stored in a different cell in process block 220. Also, a new design hierarchy is generated in block 222 based on these updated cell definitions. Finally, the processed design is stored in a data store 224.

The next aspect concerns the extraction of or tagging of the template cores based on the new cell hierarchy of the processed output design. Specifically, now that the overlap regions have been addressed and the polygons are only found in leaf cells, the template cores are preferably now identified.

The template cores are the cells that will receive the corrections to address optical proximity and process distortions and RET corrections to address the perturbations associated with the wave nature of light. Generally, selection of the template cores is intended to increase pattern repeatability while reducing complexity using cell overlap removal during the RET/OPC processing steps. In addition, it helps in containing the corrected layout or lithography data of the output design. If the template cores are too large, then there is little opportunity for cell reuse. However, if the template cores are too small, it is difficult to apply corrections.

Generally, template cores are identified based on hierarchy statistics. Quantities such as cell size determined by its bounding box, a frequency of occurrence within its parent and within the hierarchy of the design, the number of different parents, number of child cells of the cell, position in the hierarchy tree, and whether the cell was a result of an overlap identification are important metrics.

Figure 3:
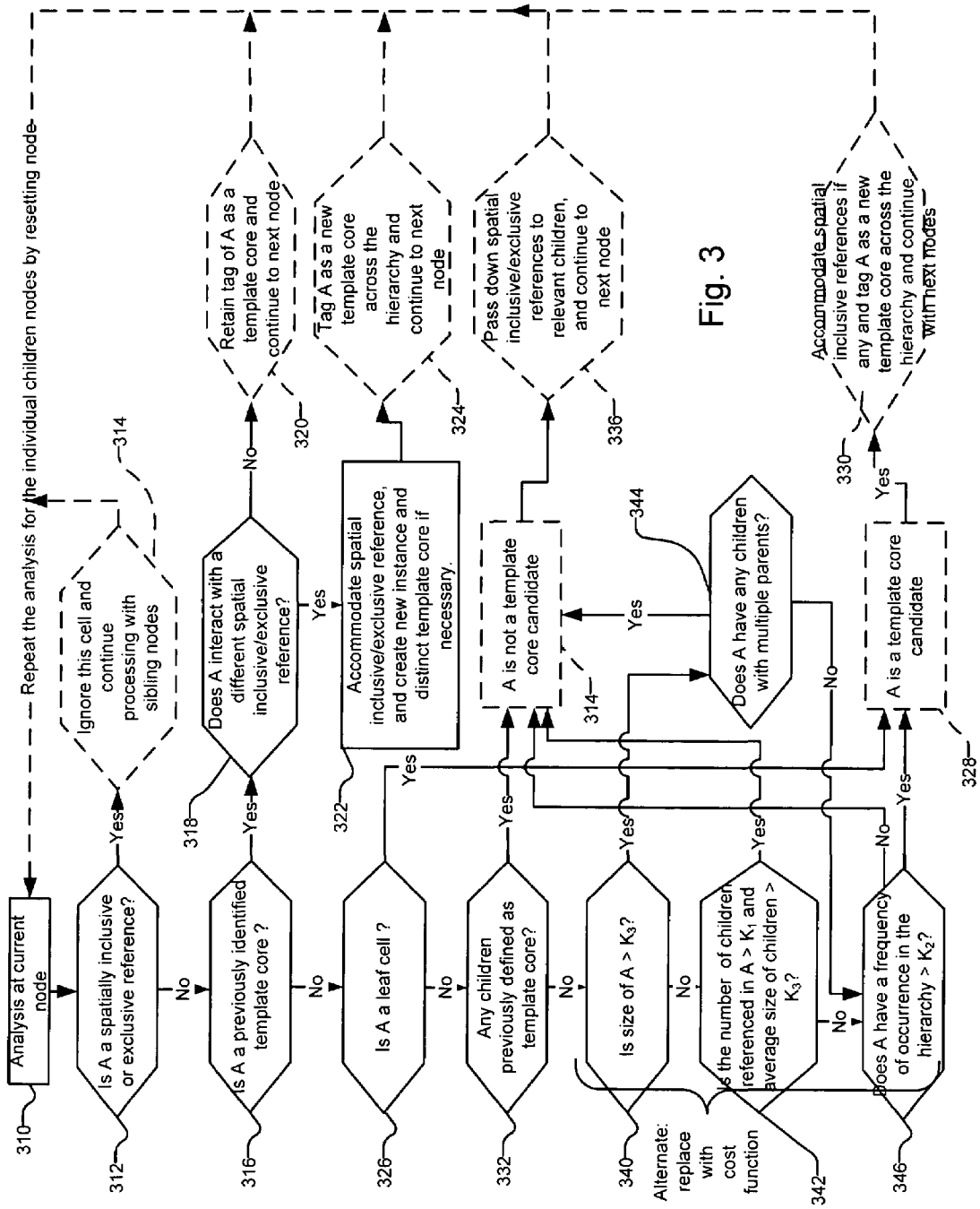
FIG. 3 is a flow diagram illustrating the process for template core identification, according to the present invention.

FIG. 3 illustrates the process for template core identification, which is performed according to the principles of the present invention. Specifically, the analysis starts in step 310 by taking up a current node in the design. Typically, the process begins with the root node, then the current node designation is updated to incrementally traverse through the design.

It is determined whether or not the current node A is spatial inclusive or exclusive reference in step 312. When a cell overlap occurs between two (or more) cells, the overlap portion is included within one cell and excluded from the other. The spatial component corresponds to the exact location within the spatial placement of the interacting cells within the chip. Typically, other locations of these cells do not necessarily interact the same way.

The cell is ignored and processing continues to the sibling nodes if it is a spatially inclusive cell in step 314.

If, however, the current node is not spatially inclusive, then step 316 determines whether or not the current node was previously identified as a template core. If it was, then it is determined in step 318 whether the current node A interacts with a different spatially inclusive/exclusive reference other than current node A in step 318. If not, then the tag for current node A is retained as a template core and processing continues to the next node in step 320.

If, however, node A does interact with a different spatial inclusive/exclusive reference, then the spatial inclusive/exclusive reference is accommodated. Specifically, the geometric content is compared with previously defined template core and a new instance created and a distinct template core created if necessary in step 322.

Next, the current node is tagged as a new template core across the hierarchy and the processing continues to the next node in step 324.

Returning, if it was determined in step 316 that node A was not previously identified as a template core, then it is determined whether or not the current node A is a leaf cell in step 326. If it is a leaf cell, then it is determined that the current node A is a template core candidate in step 328.

Spatial inclusive references are accommodated in step 330 and the current cell is tagged as a template core across the hierarchy and processing continues to the next node in step 330.

If, however, it is determined that the current node was not a leaf cell in step 326, then step 332 determines whether or not any children cells were previously defined as template cores. If the answer to this question is yes, then node A will not be a template core candidate and is designated as such in step 314.

Then, in step 336, spatial inclusive/exclusive references are passed down to the relevant children to continue processing to the next node.

If it is determined that a child node was not previously defined as a template core in step 332, then the current node size is compared against a value $K_3$ in step 340. If the size of node A is greater than $K_3$, then in step 344 it is determined whether or not any children of A have multiple parents in step 344.

If the answer is yes, then the current node is not a template core candidate in step 334. If however, some of the children do not have multiple parents, then in step 346, it is determined whether or not the frequency of occurrence of the current node A is greater than a constant $K_2$.

If it is, then A is tagged as a template core candidate in step 328 and processing continues, if not, then A is assessed not to be a template core candidate in step 334.

If, in step 340, the size of node A was less than $K_3$, then the number of children referenced by node A is compared against a constant $K_2$ and the average size of the children is compared to constant $K_3$. If the number of children exceeds $K_2$ and the average size exceeds $K_3$, then step 346 is performed. Otherwise, step 314 is performed.

Typically the constants $K_1$, $K_2$, and $K_3$ are determined from the hierarchy statistics to increase pattern repeatability when selecting template cores while maintaining the minimum cell size restriction. In a more general setting the evaluations can be done using a range for these values.

Figure 4:
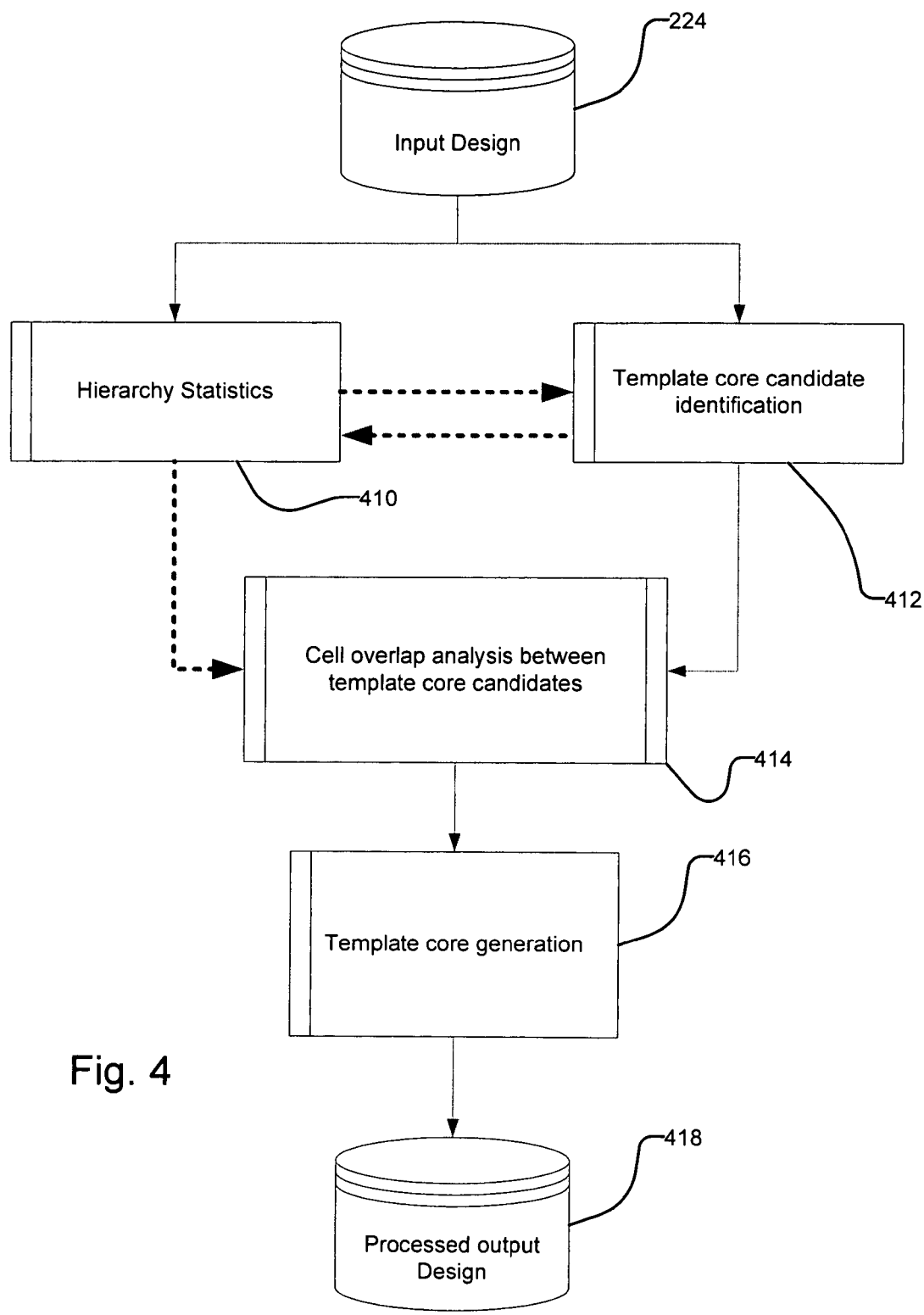
FIG. 4 is a process block diagram illustrating an alternative approach for processing the input hierarchy according to the present invention.

FIG. 4 illustrates an alternative method of processing the input hierarchy to generate the template cores according to the principles of the present invention. Specifically, the processed input design in data store 224 is accessed. From this information, hierarchy statistics are collected in block 410 and the information is assessed for the template core candidate identification in step 412. As template cores are identified, the hierarchy statistics database is updated to retain this information for subsequent processing according to the principles of the present invention. Cell overlap analysis is performed between the template core candidates in step 414. Finally, the template core is generated in step 416 and the new processed output design is stored in step 418.

Figure 5:
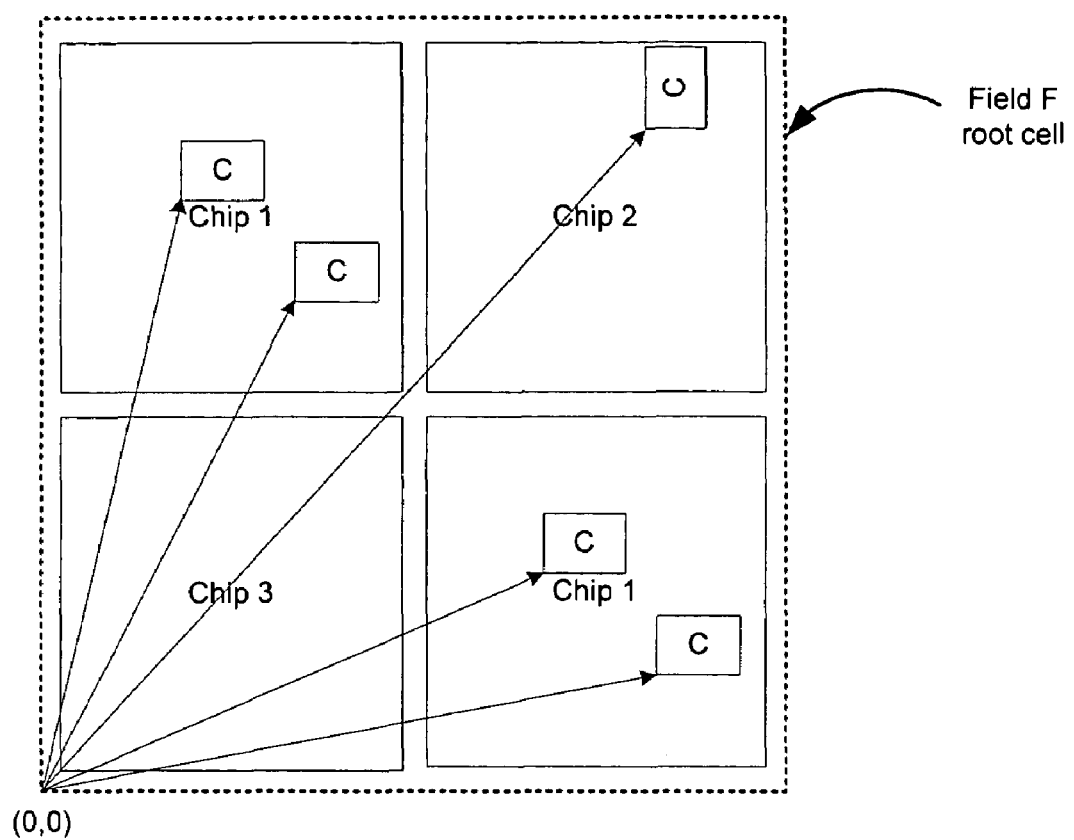
FIG. 5 is a schematic drawing illustrating the placement of multiple chips within a field and the consolidation of template cores across the field and among the chips.

FIG. 5 shows a typical placement of multiple chips Chip 1, Chip 2, Chip3, within a field F and the consolidation of template cores C across the field F.

In more detail, the typical field F includes one or multiple chips Chip 1, Chip 2, Chip3. These can be the same chip design or different chip designs.

Often, the chips Chip 1, Chip 2, Chip3 will be designed using the same building blocks C in addition to blocks that are custom for each separate chip. In one embodiment, when correcting for effects across the field F, a root cell is built for the field F. Then the individual analyses of each distinct chip is consolidated into the single field thereby accommodating for repeating patterns C across the chips Chip 1, Chip 2, Chip3.

If all the chips were identical, then an analysis of one chip provides an analysis for the field. All repeating patterns that are local to the chip are treated as such.

In one example, by applying knowledge of the feature tolerances for features within the repeating patterns C, and allowing design corrections only when tolerances are not met, the design hierarchy can be preserved through the correction process, either in part or completely. This is described in U.S. Pat. Appl. Publication No. US 2006/0075379 A1, published on Apr. 6, 2006, by Vishnu Govind Kamat, filed on an even date herewith, which application being incorporated herein in its entirety by this reference. Generally, this technique relies on determining a correction for the repeating pattern based on a first set of tolerances for features of the repeating pattern. Then, the suitability of the corrections is evaluated for instances of the repeating pattern in the integrated circuit design based on a second set of tolerances.

Figure 6:
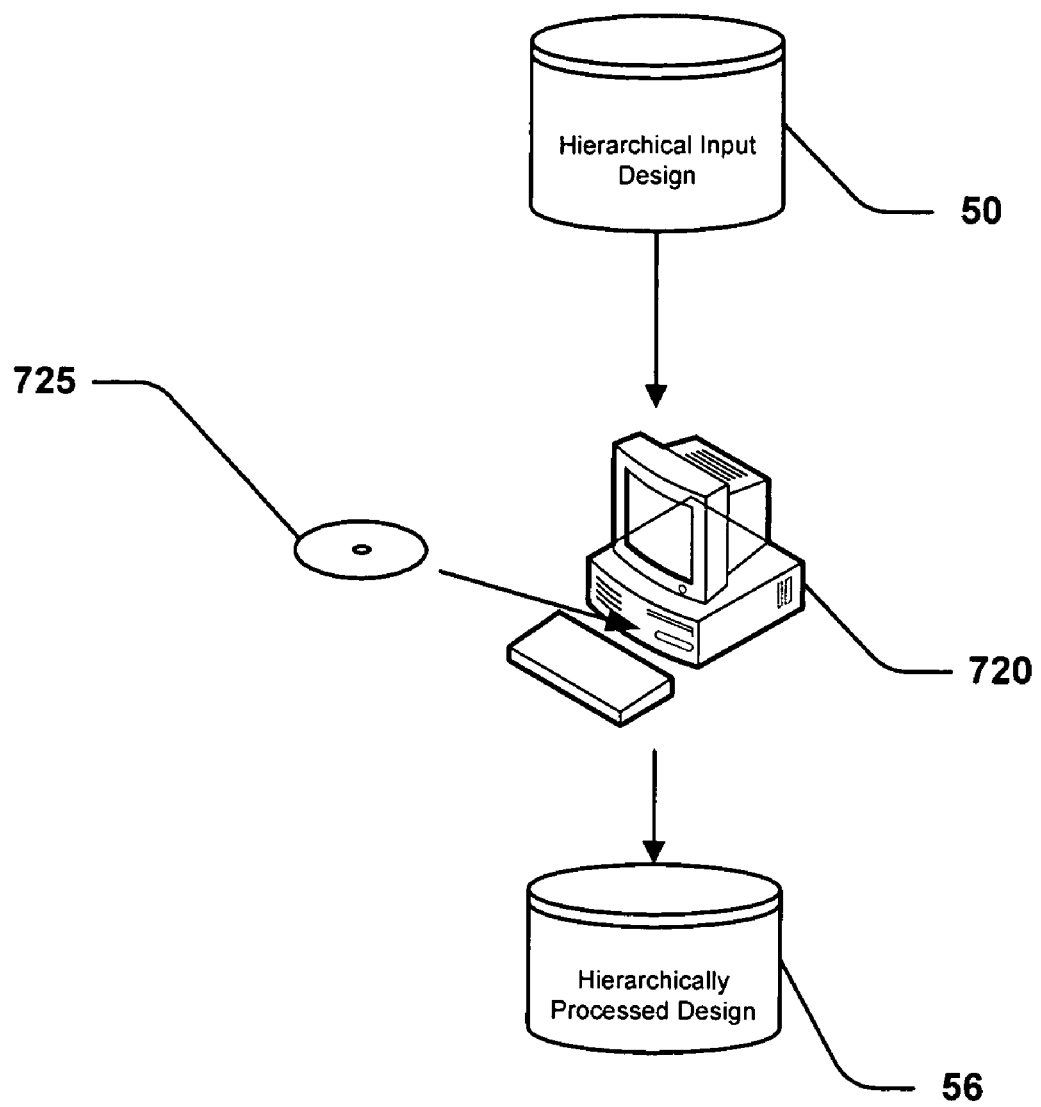
FIG. 6 is a schematic diagram illustrating system and software product of the present invention.

FIG. 6 illustrates the typical manner in which the present invention is applied to the target data.

The target layout data 50 are stored in a data store such as a storage device or disk drive. The data are then accessed by a compute resource 720, such as a workstation computer. Often, this computer 720 is a multiprocessor/parallel processing computer or a distributed network of computers units. These types of computers are required because of the computationally intensive nature of processing large target layout files and OPC and other perturbation modeling.

The computer 720 receives a program implementing the inventive method, such as on disk 725.

The resulting hierarchy-analyzed and modified and corrected lithography data 56 are stored in a data storage device.

Then, the data are appropriately fractured to a format acceptable to the writing tool and transmitted to and/or accessed by a mask writing tool, which then uses the fractured mask lithography data to generate the mask.

Alternatively, the lithography data are used to drive a direct-write device such as a lithography tool with a spatial light modulation system.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method operating in a computer system for modifying cells to address overlap regions in an integrated circuit design having a hierarchal structure, the method comprising:
    using the computer system to traverse through nodes of the hierarchal structure of the integrated circuit design, wherein the nodes represents cells of the integrated circuit design;
    analyzing children nodes of a parent node for cell overlap;
    locating an overlap region of first and second cells, wherein the first and second cells are in at least two of the children nodes;
    extracting information of the overlap region;
    creating a copy of the overlap region;
    making a reference to the copy of the overlap region in the parent node and the children nodes containing the overlap region, wherein the reference comprises a location of the overlapping region in the integrated circuit design and an origin of the overlapping region in the hierarchical structure;
    finding candidate cells for template core designation, wherein the step of finding candidate cells is applied to modified cells, which are produced during the steps of extracting information of the overlap regions and collecting information of the overlap regions; and
    tagging the candidate cells.

2. A method as claimed in claim 1, wherein the overlap regions are determined by bounding boxes, geometric convex hulls, or bounding polygons of the cells.

3. A method as in claimed in claim 2, wherein the bounding boxes, geometric convex hulls, or bounding polygons dimensions are modified to extract additional polygons within a neighborhood of the cells.

4. A method as claimed in claim 1, wherein modifying the integrated circuit design including the first and the second cells to correct for process and optical distortions during rendering.

5. A method as claimed in claim 4, wherein the modifying comprises compensating for perturbations during rendering of the integrated circuit design.

6. A method as claimed in claim 5 wherein the perturbations are created by optical proximity effects.

7. A method as claimed in claim 5 wherein the perturbations are created by process effects.

8. A method as claimed in claim 1, further comprising storing an origin of the overlap region of the first and second cells.

9. A method as claimed in claim 1, wherein the step of finding candidate cells is applied before the steps of extracting overlap regions and collecting the overlap regions.

10. A method as claimed in claim 9, wherein the template core candidates are modified for cell overlap to generate template cores.

11. A method as claimed in claim 1, wherein the candidate cells are selected based on size of the cells.

12. A method as claimed in claim 1, wherein the candidate cells are selected based on frequency of occurrence.

13. A method as claimed in claim 1, wherein the candidate cells are further selected based on frequency of occurrence of the children and the size of the children.

14. A method as claimed in claim 1, further comprising modifying the candidate cells to correct for optical and/or process perturbations during rendering.

15. A method as claimed in claim 1, wherein the step of traversing begins with a root cell.

16. A method as claimed in claim 1, further comprising creating a root cell if no root cell exists in the hierarchical integrated circuit design.

17. A method as claimed in claim 1, further comprising pushing any polygons in cells of the design to leaf cells.

18. The method of claim 1, wherein the reference includes inclusion and exclusion references.

19. A system for modifying cells to address overlap regions in an integrated circuit design having a hierarchal structure, the system comprising:
    a datastore for storing the integrated circuit design; and
    a processing resource coupled to the datastore for performing the operations of:
    traversing through nodes of the hierarchal structure of the integrated circuit design, wherein the nodes represents cells of the integrated circuit design;
    analyzing children nodes of a parent node for cell overlap;
    locating an overlap region of first and second cells, wherein the first and second cells are in at least two of the children nodes;
    extracting information of the overlap region;
    creating a copy of the overlap region;
    making a reference to the copy of the overlap region in the parent node and the children nodes containing the overlap region, wherein the reference comprises a location of the overlapping region in the integrated circuit design and an origin of the overlapping region in the hierarchical structure;
    finding candidate cells for template core designation, wherein the step of finding candidate cells is applied to modified cells, which are produced during the steps of extracting information of the overlap regions and collecting information of the overlap regions; and
    tagging the candidate cells.

20. A system as claimed in claim 19, wherein the overlap regions are determined by bounding boxes, geometric convex hulls, or bounding polygons of the cells.

21. A system as claimed in claim 19, wherein the processing resource modifies the integrated circuit design including the first and the second cells to correct for process and optical distortions during rendering.

22. A system as claimed in claim 19, wherein the processing resource determines corrections to modified cells, which are produced during the operations of adding and deleting the extracted information.

23. A system as claimed in claim 22, wherein the corrections compensate for perturbations during rendering of the integrated circuit design.

24. The system of claim 19, wherein the reference includes inclusion and exclusion references.

25. A computer software product for analyzing an integrated circuit design having a hierarchical structure, the product comprising a computer-readable medium in which program instructions are stored, which instructions, when read by a computer system, cause the computer system to:

traverse through nodes of the hierarchal structure of the integrated circuit design, wherein the nodes represents cells of the integrated circuit design;

analyze children nodes of a parent node for cell overlap;

locate an overlap region of first and second cells, wherein the first and second cells are in at least two of the children nodes;

extract information of the overlap region;

make a reference to the copy of the overlap region in the parent node and the children nodes containing the overlap region, wherein the reference comprises a location of the overlapping region in the integrated circuit design and an origin of the overlapping region in the hierarchical structure;

finding candidate cells for template core designation, wherein the step of finding candidate cells is applied to modified cells, which are produced during the steps of extracting information of the overlap regions and collecting information of the overlap regions; and tagging the candidate cells.

26. The computer software product of claim 25, wherein the reference includes inclusion and exclusion references.

* * * * *

UNITED STATES PATENT AND TRADEMARK OFFICE
CERTIFICATE OF CORRECTION

| | | |
|---|---|---|
| PATENT NO. | : 7,669,158 B2 | Page 1 of 1 |
| APPLICATION NO. | : 10/955067 | |
| DATED | : February 23, 2010 | |
| INVENTOR(S) | : Vishnu Govind Kamat | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 590 days.

Signed and Sealed this

Seventh Day of December, 2010

David J. Kappos
*Director of the United States Patent and Trademark Office*